United States Patent
Luan et al.

(10) Patent No.: US 11,555,860 B2
(45) Date of Patent: Jan. 17, 2023

(54) METHOD FOR TESTING AND EVALUATING MECHANICAL PERFORMANCE OF LITHIUM ION BATTERY ELECTRODE BASED ON NANO-INDENTATION TECHNOLOGY

(71) Applicant: East China University of Science and Technology, Shanghai (CN)

(72) Inventors: Weiling Luan, Shanghai (CN); Ying Chen, Shanghai (CN); Senming Wu, Shanghai (CN); Haofeng Chen, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 142 days.

(21) Appl. No.: 17/301,894

(22) Filed: Apr. 19, 2021

(65) Prior Publication Data
US 2022/0221522 A1  Jul. 14, 2022

(30) Foreign Application Priority Data
Jan. 8, 2021  (CN) .......................... 202110029029.2

(51) Int. Cl.
| | | |
|---|---|---|
| *G01R 31/00* | (2006.01) | |
| *G01R 31/392* | (2019.01) | |
| *H01M 10/04* | (2006.01) | |
| *H01M 10/0525* | (2010.01) | |
| *H01M 10/0569* | (2010.01) | |
| *H01M 10/42* | (2006.01) | |

(52) U.S. Cl.
CPC ...... *G01R 31/392* (2019.01); *H01M 10/0427* (2013.01); *H01M 10/0525* (2013.01); *H01M 10/0569* (2013.01); *H01M 10/4285* (2013.01); *H01M 2300/0028* (2013.01)

(58) Field of Classification Search
USPC .......................................... 324/426, 432–435
See application file for complete search history.

(56) References Cited

U.S. PATENT DOCUMENTS

2019/0049518 A1* 2/2019 Shen ..................... H01M 10/48

OTHER PUBLICATIONS

Xu, R., et al., Mechanical and Structural Degradation of LiNixMnyCozO2 Cathode in Li-Ion Batteries: An Experimental Study, Journal of the Electrochemical Society, 164 (13) A3333-A3341 (2017).

* cited by examiner

*Primary Examiner* — Vincent Q Nguyen
(74) *Attorney, Agent, or Firm* — Bayramoglu Law Offices LLC

(57) ABSTRACT

A method for testing a mechanical performance of a lithium ion battery electrode based on a nano-indentation technology includes following steps: connecting an assembled lithium ion battery with an electrochemical test device and setting different test working conditions, so that cyclic charge and discharge experiments are performed on the battery to obtain an attenuation curve of a battery capacity; disassembling the battery and taking out the electrode; scraping some powder from a surface of the cyclic electrode plate and an initial uncyclic electrode plate, and laying down the powder in cold mounting molds separately, pouring the cold mounting solution into the molds; taking out the samples from the molds respectively after the liquid is completely cured and cooled; detecting a mechanical performance after polishing the samples surfaces and analyzing the mechanical performance decay rule of the electrodes.

5 Claims, 3 Drawing Sheets

METHOD FOR TESTING AND EVALUATING MECHANICAL PERFORMANCE OF LITHIUM ION BATTERY ELECTRODE BASED ON NANO-INDENTATION TECHNOLOGY

CROSS REFERENCE TO RELATED APPLICATION

This application claims the benefit of priority of Chinese Patent Application No. 202110029029.2, entitled "Method for Testing and Evaluating Mechanical Performance of Lithium Ion Battery Electrode Based on Nano-indentation Technology" filed with the China National Intellectual Property Administration on Jan. 8, 2021, which is incorporated herein by reference in its entirety.

TECHNICAL FIELD

The disclosure relates to a field of a nano-mechanics performance test of a lithium ion battery electrode material, in particular to a mechanical performance research method for a battery electrode based on the nano-indentation technology, which may analyze the mechanical performance decay rules of lithium ion battery electrodes. The method may perform nano-indentation testing on the electrode material after the electrochemical test of the lithium ion battery, thereby obtaining mechanical properties of the electrode material under different working conditions.

BACKGROUND

Lithium ion batteries are widely used in the field of electronic products and new energy automobiles due to the advantages of high energy density, low self-discharge rate, no memory effect, high safety and the like. During the charge and discharge of the lithium ion battery, the active substance structure of the electrode material may change with the lithium ions being embedded and removed, and this causes expansion and contraction of the volume, thereby affecting the mechanical properties of the electrode, which is also one of the main reasons for battery capacity decay.

Since the active particle size of the electrode is in microscale, the microscopic characterization of mechanical properties of the electrode cannot adopt conventional mechanical test methods, and requires the nano-indentation technology. The nano-indentation method is proposed by Oliver and Pharr et al. in the 1990s, as a micro-area and micro-damage test method, and can perform a test on micro-scale samples. The load-displacement data obtained by the test may be analyzed and calculated to obtain microscopic mechanical performance parameter values (such as Young's modulus and hardness) of a material, which has an important meaning for the performance deterioration mechanism of a lithium ion battery electrode.

For the mechanical performance test of battery electrodes, scholars have carried out relevant research. The Zhao team conducts a series of nano-indentation experiments on the polycrystalline ternary positive electrode material, and they investigate the effect of the number of cycles on the Young's modulus and hardness of the electrode material (R. Xu, H. Sun, L. Vasconcelos, K. Zhao. Mechanical and Structural Degradation of $LiNi_xMn_yCo_zO_2$ Cathode in Li-Ion Batteries: An Experimental Study[J]. Journal of The Electrochemical Society, 2017, 164(13): A3333-A3341). In this method, positive electrodes (including an active substance layer and a current collector) after different cycles are embedded in a resin for sample preparation and polishing to test and obtain the mechanical properties of the electrode material. Since the electrode active substance layer is thinner, and the nano-indentation technology requires higher flatness and smoothness of the surface of the sample, the method is difficult for sample preparation and testing, and is very difficult to be widely used.

SUMMARY

The present disclosure provides a method for testing and evaluating a mechanical performance of a lithium ion battery electrode based on a nano-indentation technology for the problem proposed in the background art. The method is simple and effective, and the mechanical properties of the electrode material under different working conditions can be obtained.

The present disclosure is achieved by following technical solutions:

A method for testing and evaluating a mechanical performance of a lithium ion battery electrode based on the nano-indentation technology, comprising following steps:

(1) Electrochemical cycling test of a lithium ion battery:

S1. Connecting an assembled lithium ion battery with an electrochemical test device, so that the lithium battery to be tested is charged and discharged for a preset number of cycles in a preset test working condition to obtain an attenuation curve of a battery capacity;

(2) Disassembling battery and taking out electrode: disassembling a battery obtained in step (1) S1 in a glove box filled with argon gas, and taking out an electrode plate, then cleaning the electrode plate with dimethyl carbonate for not less than three times, and placing the electrode plate in a vacuum drying box for not less than 3 hours;

(3) Preparing nano-indentation sample:

S2. Mixing the acrylic resin or epoxy resin with curing agent at a mass ratio of 1:0.8 and stirring uniformly;

S3. Scraping powder from surfaces of the electrode plate obtained in step (2) and the electrode plate that is not initially tested for charging and discharging, and laying down the powder in cold mounting molds separately, pouring solution obtained in S2 into the molds, and curing and cooling the solution fully;

S4. taking out samples obtained in S3 from the molds respectively, and polishing surfaces of the samples with diamond polishing agent having particle sizes of 3 μm and 1 μm and silica polishing agent of 0.05 μm successively to smooth the surfaces of the samples, and finally cleaning the samples with isopropanol;

(4) Detecting the mechanical performance of the samples: placing the samples obtained in step (3) S4 in a nano-indenter to search for under a light microscopy and mark active substance particles, then performing a nano-indentation test according to an Oliver-Pharr method using a Berkovich indenter to obtain Young's modulus E and hardness H of a micro-area of the samples mark;

(5) Evaluating the mechanical performance decay rule of the electrodes: obtaining Young's modulus $E_0$ and hardness $H_0$ of the electrode plate that is not initially tested for cyclic charging and discharging and Young's modulus $E_C$ and hardness $H_C$ of the electrode plate after cyclic charging and discharging from the mechanical performance test in step (4), calculating Young's modulus attenuation rate $E_D=(E_0-E_C)/E_0$ and hardness attenuation rate $H_D=(H_0-H_C)/H$, and then performing a two-parameter logarithmic fitting y=a*ln(x+b) between the attenuation rate and corresponding number of electrochemical cycles (i.e., the number of charging and discharging) to obtain a performance decay rule of the lithium ion battery electrode, wherein x is the number of electrochemical cycles, y is the Young's modulus attenuation rate or hardness attenuation rate, and a, b are fitting parameters.

The lithium ion battery in step (1) is a button battery. The positive and negative electrode materials, electrolytic solutions, separators and the like used are commercially available materials. The positive electrode material includes a spinel structure material, an olivine structure material, a layered structure material and a lithium-rich material, and a thickness of the positive electrode material ranges from 10-40 μm. The electrolyte includes polymer solid electrolyte of polyoxyethylene and its derivative or liquid electrolyte with lithium hexafluorophosphate as solute and organic solvent as solvent. The negative electrode material is one of a lithium plate, a carbon negative electrode material and a silicon carbon negative electrode material.

The organic solvent of the liquid electrolyte is one or more selected from dimethyl carbonate, vinyl carbonate, propylene carbonate, diethyl carbonate and methyl ethyl carbonate.

The water oxygen concentration of the glove box filled with argon gas in step (2) is less than 0.1 mg/L.

The curing agent in step (3) is aliphatic amine, alicyclic map and polyamide.

Beneficial Effects:

The present disclosure provides a method for evaluating a mechanical performance test of a lithium ion battery electrode based on nano-indentation technology. A material microstructure of the lithium ion battery electrodes after electrochemical cycling can be observed under different working conditions to obtain mechanical performance parameters of active particles, which can be used for analyzing the performance decay rule of the lithium ion battery electrodes, and providing input parameters for the electrochemical coupling simulation of the battery.

The method of the present disclosure can be applicable to lithium ion battery electrode mechanical performance studies, and also to mechanical performance tests of other similar materials.

DETAILED DESCRIPTION OF THE EMBODIMENTS

The present disclosure is further described below in conjunction with the accompanying drawings and specific embodiments, but not limited to the scope of protection of the present disclosure.

Embodiments: a method for testing and evaluating a mechanical performance of a lithium ion battery electrode based on nano-indentation technology, comprises following steps specifically:

Assembling lithium ion battery: a plurality of CR-2025 button batteries are assembled in a glove box filled with argon gas (water oxygen concentration lower than 0.1 mg/L) by using material such as single crystal $LiNi_{0.5}Co_{0.2}Mn_{0.3}O_2$ (NCM 523), a Li negative electrode, a lithium hexafluorophosphate electrolyte solution, and a Celgard-2500 membrane, and the like, and button batteries assembled are rest in a glove box for 6 hours.

Figure 1:
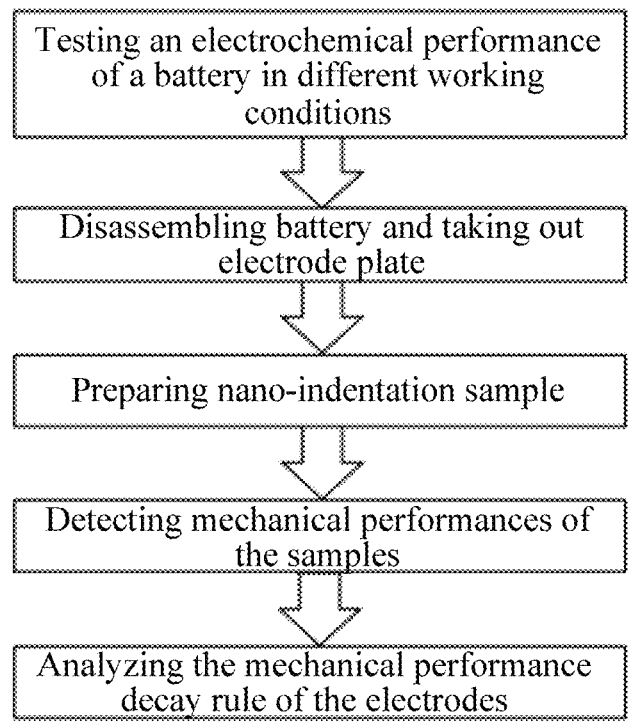
FIG. 1 is a flowchart of testing and evaluating the mechanical performance of the lithium ion battery electrodes based on nano-indentation technology in the present disclosure.
Figure 2:
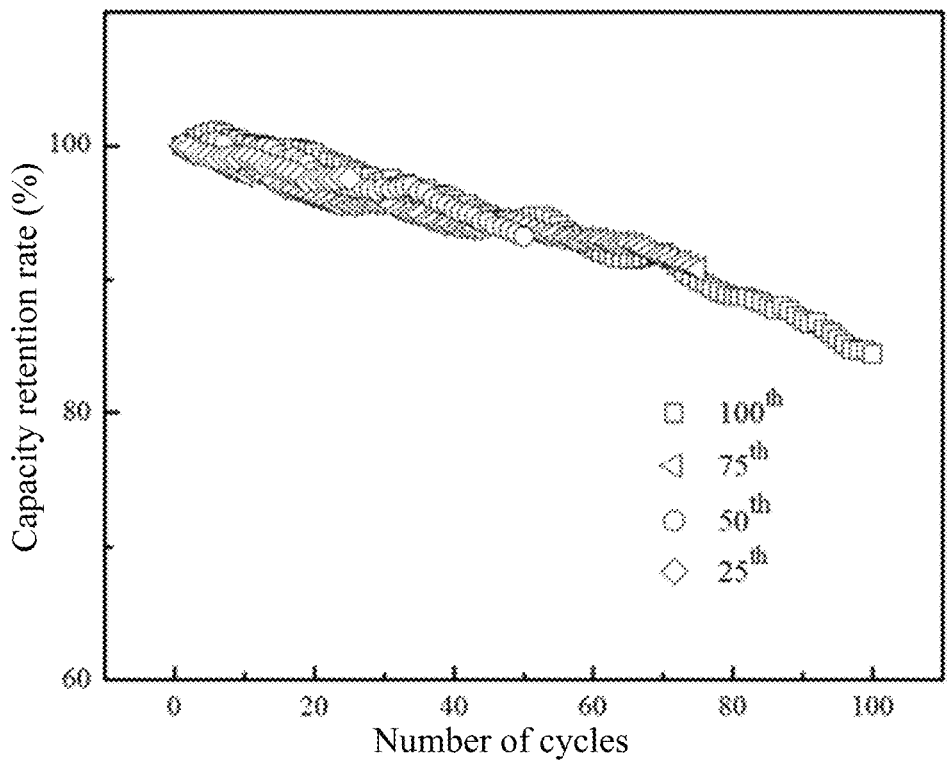
FIG. 2 is an attenuation curve of the capacity of a lithium ion battery according to the present disclosure with respect to the number of cycles.

Electrochemical cycling test of a lithium ion battery: the batteries are taken out to connect with the electrochemical test device to perform an electrochemical cycling test with a charge and discharge rate of 1 C under a constant potential of 2.8-4.3V voltage window, set the number of cycles of different batteries to be 25, 50, 75 and 100 to obtain attenuation curves of the battery capacity with the number of cycles as shown in FIG. 2, which illustrates that the electrochemical performance of the different batteries is substantially consistent.

Disassembling battery and taking out electrode: the battery after the cycle of charge and discharge is disassembled in a glove box filled with argon gas, and the electrode plates are taken out with a forcep, cleaned with dimethyl carbonate for three times, and placed in a vacuum drying box at indoor temperature for 3 hours.

Figure 3:
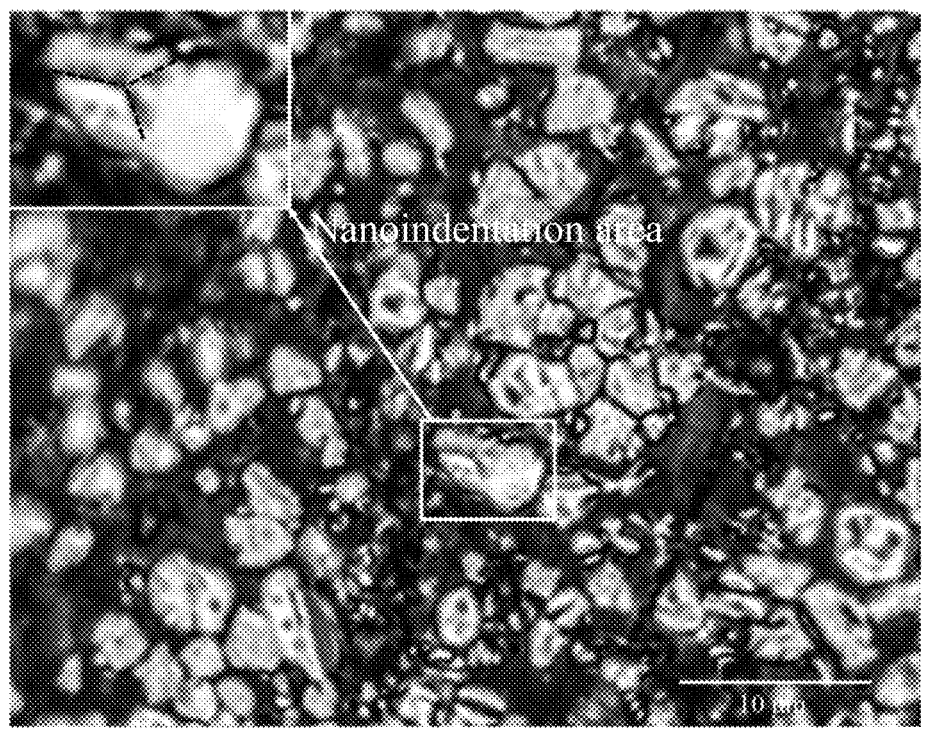
FIG. 3 is a microscopic topography of a nano-indentation test sample of the present disclosure.

Nano-indentation sample preparation: some powder are scraped from surfaces of the electrode plate after the cycle and the electrode plate on which the cycling test has not been performed, and the powder are laid down in different cold inlay molds. The acrylic resin powder and the aliphatic amine curing agent are mixed and stirred uniformly at a mass ratio of 1:0.8 and respectively poured into molds. After the liquid is completely cured and cooled, the samples is taken out from the molds respectively. The surfaces of the samples are polished with diamond polishing agent having particle sizes of 3 μm and 1 μm and silica polishing agent of 0.05 μm to smooth the surfaces of the samples as a mirror. Finally, the samples are cleaned with isopropanol to complete the nano-indentation sample preparation as shown in FIG. 3.

Figure 4:
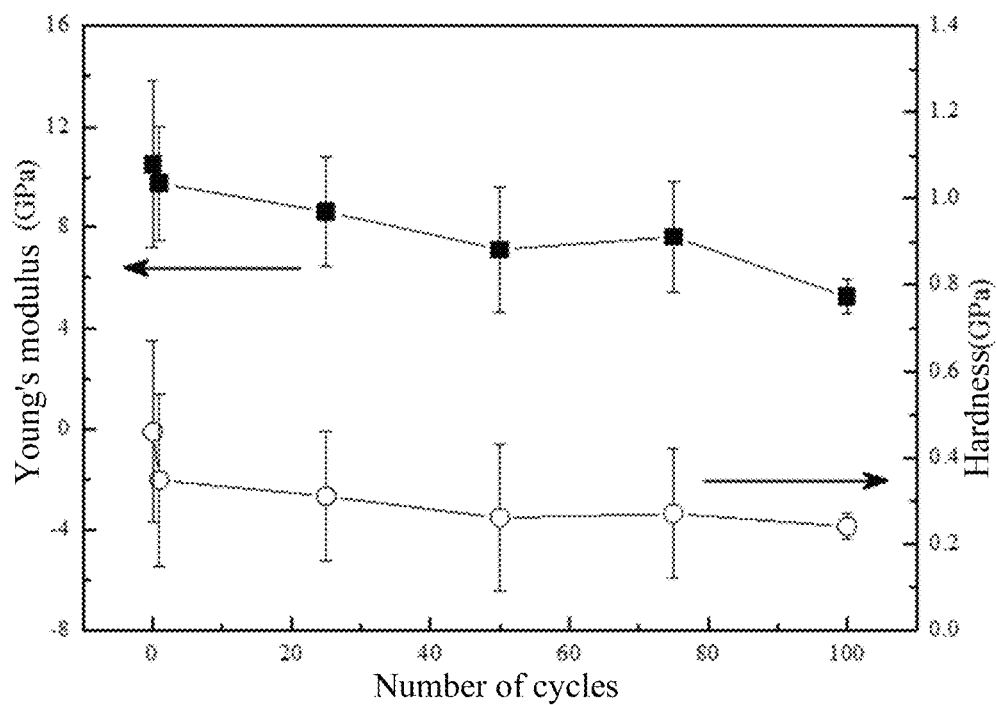
FIG. 4 is a graph of the relationship between Young's modulus and hardness of active particles in a nano-indentation test sample of the present disclosure with the number of electrochemical cycles.

Mechanical performance detection of the samples: the samples are placed in a nano-indenter respectively to search for active substance particles under a light microscopy and mark the same; and a nano-indentation test is performed according to an Oliver-Pharr method using a Berkovich indenter to obtain Young's modulus E and hardness H of a micro-area of the sample mark, as shown in FIG. 4.

Figure 5:
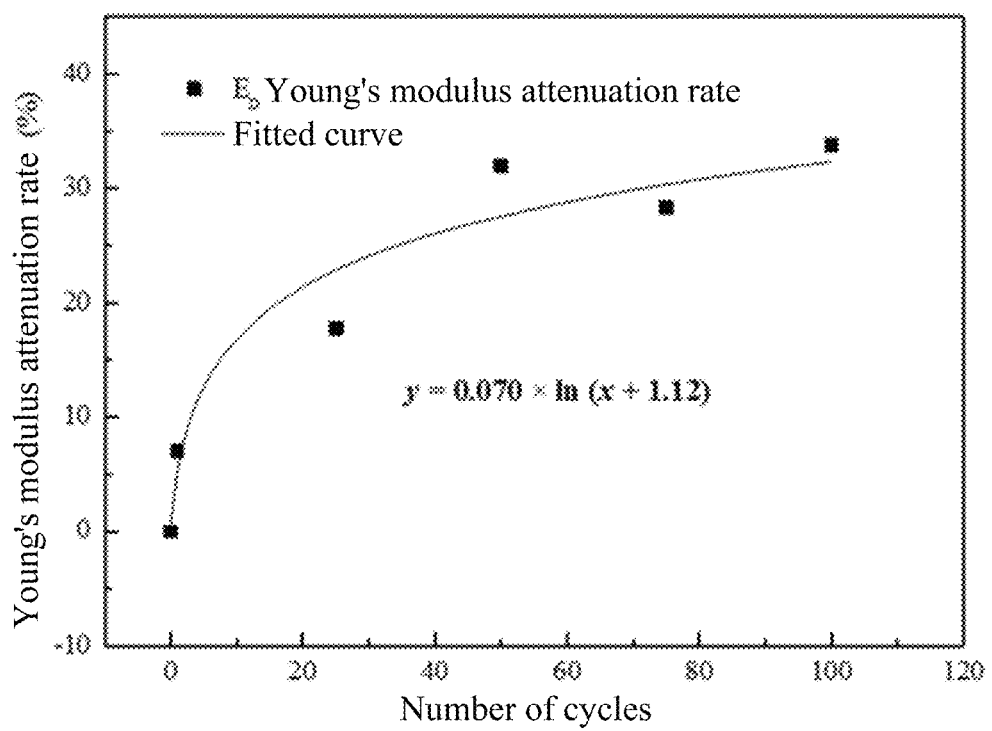
FIG. 5 is a fitted cure of the relationship between Young's modulus attenuation rate of active particles in a nano-indentation test sample of the present disclosure and the number of electrochemical cycles.

Analysis of the mechanical performance decay rule of the electrodes: the mechanical data of electrode plates without cycling test and electrode plates after 25, 50, 75 and 100 cycles are analyzed to obtain a relationship curve between the Young's modulus and the hardness of the electrode plate and the number of electrochemical cycles, as shown in FIG. 5. The Young's modulus attenuation rate is calculated as $E_D=(E_0-E_C)/E_0$, wherein $E_0$ is the Young's modulus of an initial electrode plate and $E_c$ is the Young's modulus of cycled electrode plate. Further, a two-parameter logarithmic fitting $y=a*\ln(x+b)$ between the attenuation rate and corresponding number of electrochemical cycles is performed to obtain a mechanical performance decay rule $y=0.07*\ln(x+1.12)$ of the lithium ion battery electrode, as shown in FIG. 5.

The results show that as progress of electrochemical cycle, the mechanical properties of the single crystal NMC particles decrease significantly, and the Young's modulus decreases with the increase of number of charging-discharging cycles. The obtained quantitative change rule of the NMC single crystal mechanical properties with the number of cycles provides important input parameters for modeling analysis of the subsequent electrochemical behavior of the battery electrode, and the damage accumulation of the NMC material during cycling is evaluated.

What is claimed:

1. A method for testing and evaluating a mechanical performance of a lithium ion battery electrode based on nano-indentation technology, comprising:

(1) electrochemical cycling test of a lithium ion battery:

S1. connecting an assembled lithium ion battery with an electrochemical test device, so that the lithium ion battery to be tested is charged and discharged for a preset number of cycles in a preset test working condition to obtain an attenuation curve of a battery capacity;

(2) disassembling battery and taking out electrode:

disassembling a battery obtained in step (1) S1 in a glove box filled with argon gas, and taking out an electrode plate, then cleaning the electrode plate with dimethyl carbonate for not less than three times, and placing the electrode plate in a vacuum drying box at 25° C. for not less than 3 hours;

(3) preparing nano-indentation samples:

S2. mixing acrylic resin or epoxy resin with curing agent at a mass ratio of 1:0.8 and stirring uniformly;

S3. scraping powder from surfaces of the electrode plate obtained in step (2) and the electrode plate that is not initially tested for charging and discharging, and laying down the powder in cold mounting molds separately, pouring solution obtained in S2 into the molds, and curing and cooling the solution fully;

S4. taking out samples obtained in S3 from the molds respectively, and polishing surfaces of the samples with diamond polishing agent having particle sizes of 3 μm and 1 μm andsilica polishing agent of 0.05 μm successively to smooth the surfaces of the samples, and finally cleaning the samples with isopropanol;

(4) detecting the mechanical performance of the samples: placing the samples obtained in step (3) S4 in a nano-indenter to search for under a light microscopy and mark active substance particles, then performing a nano-indentation test according to an Oliver-Pharr method using a Berkovich indenter to obtain Young's modulus E and hardness H of a micro-area of the samples mark;

(5) evaluating the mechanical performance decay rule of the electrodes: obtaining Young's modulus $E_0$ and hardness $H_0$ of the electrode plate that is not initially tested for cyclic charging and discharging and Young's modulus $E_c$ and hardness $H_c$ of the electrode plate after cyclic charging and discharging from the mechanical performance test in step (4), calculating Young's modulus attenuation rate $E_D=(E_0-E_C)/E_0$ and hardness attenuation rate $H_D=(H_0-H_C)/H$, and then performing a two-parameter logarithmic fitting $y=a*\ln(x+b)$ between the attenuation rate and corresponding number of electrochemical cycles to obtain a mechanical performance decay rule of the lithium ion battery electrode, wherein x is a number of electrochemical cycles, y is the Young's modulus attenuation rate or the hardness attenuation rate, and a, b are fitting parameters.

2. The method for testing and evaluating the mechanical performance of the battery electrode according to claim 1, wherein the lithium ion battery in step (1) is a button battery; positive and negative electrode materials, electrolytic solution and separator used are commercially available; the positive electrode material is one of a spinel structure material, an olivine structure material, a layered structure material and a lithium-rich material, and a thickness of the positive electrode material ranges from 10-40 μm; electrolyte includes polymer solid electrolyte of polyoxyethylene and its derivatives or liquid electrolyte with lithium hexafluorophosphate as solute and organic solvent as solvent; and the negative electrode material is one of a lithium plate, a carbon negative electrode material and a silicon carbon negative electrode material.

3. The method for testing and evaluating the mechanical performance of the battery electrode according to claim 2, wherein the organic solvent of the liquid electrolyte is one or more selected from dimethyl carbonate, vinyl carbonate, propylene carbonate, diethyl carbonate and methyl ethyl carbonate.

4. The method for testing and evaluating the mechanical performance of the battery electrode according to claim 1, wherein water oxygen concentration of the glove box filled with argon gas in step (2) is less than 0.1 mg/L.

5. The method for testing and evaluating the mechanical performance of the battery electrode according to claim 1, wherein the curing agent in step (3) is aliphatic amine, alicyclic map and polyamide.

* * * * *